United States Patent [19]
Joist

[11] Patent Number: 5,154,300
[45] Date of Patent: Oct. 13, 1992

[54] COMPONENT CARRIER

[75] Inventor: Michael Joist, Gaggenau, Fed. Rep. of Germany

[73] Assignee: Schroff GmbH, Straubenhardt, Fed. Rep. of Germany

[21] Appl. No.: 755,139

[22] Filed: Sep. 5, 1991

[30] Foreign Application Priority Data

Sep. 8, 1990 [DE] Fed. Rep. of Germany ... 9012844[U]

[51] Int. Cl.⁵ ............................................. A47G 19/08
[52] U.S. Cl. .................................... 211/41; 403/260; 403/258; 361/415
[58] Field of Search ............... 361/415; 248/223.4, 248/224.4; 108/111, 153; 211/41, 186, 187; 403/260, 258

[56] References Cited

U.S. PATENT DOCUMENTS

| | | | |
|---|---|---|---|
| 3,699,393 | 10/1972 | Reimer | 361/415 |
| 3,733,523 | 5/1973 | Reynolds et al. | 211/41 X |
| 3,816,011 | 6/1974 | Biebuyck et al. | 403/260 X |
| 4,013,928 | 3/1977 | Sarinopoulos et al. | 211/41 X |
| 4,183,488 | 1/1980 | Shepard | 108/111 X |
| 4,563,040 | 1/1986 | Alster | 108/153 X |
| 4,568,050 | 2/1986 | Radoy et al. | 248/239 X |
| 4,650,261 | 3/1987 | Winter et al. | 108/111 X |
| 4,669,616 | 6/1987 | Mazura | 361/415 X |

*Primary Examiner*—Carl D. Friedman
*Assistant Examiner*—Korie H. Chan
*Attorney, Agent, or Firm*—Spencer, Frank & Schneider

[57] ABSTRACT

A component carrier for circuit boards equipped with electrical and electronic components and insertable on guide rails has two parallel side walls as well as four front and rear module rails which connect the side walls and support the guide rails. In order to prevent twisting of the module rails relative to the side walls and permit accurate assembly, the side walls are provided, for the fastening of the module rails, with groups of fastening elements in the form of holes and with pins that project toward the interior. Each one of these groups of fastening elements has four fixing pins that are disposed in the corners of a rectangle and form two pairs and each group additionally has an associated fastening hole. The profiles of the module rails here engage matingly into the space between each pair of fixing pins.

11 Claims, 2 Drawing Sheets

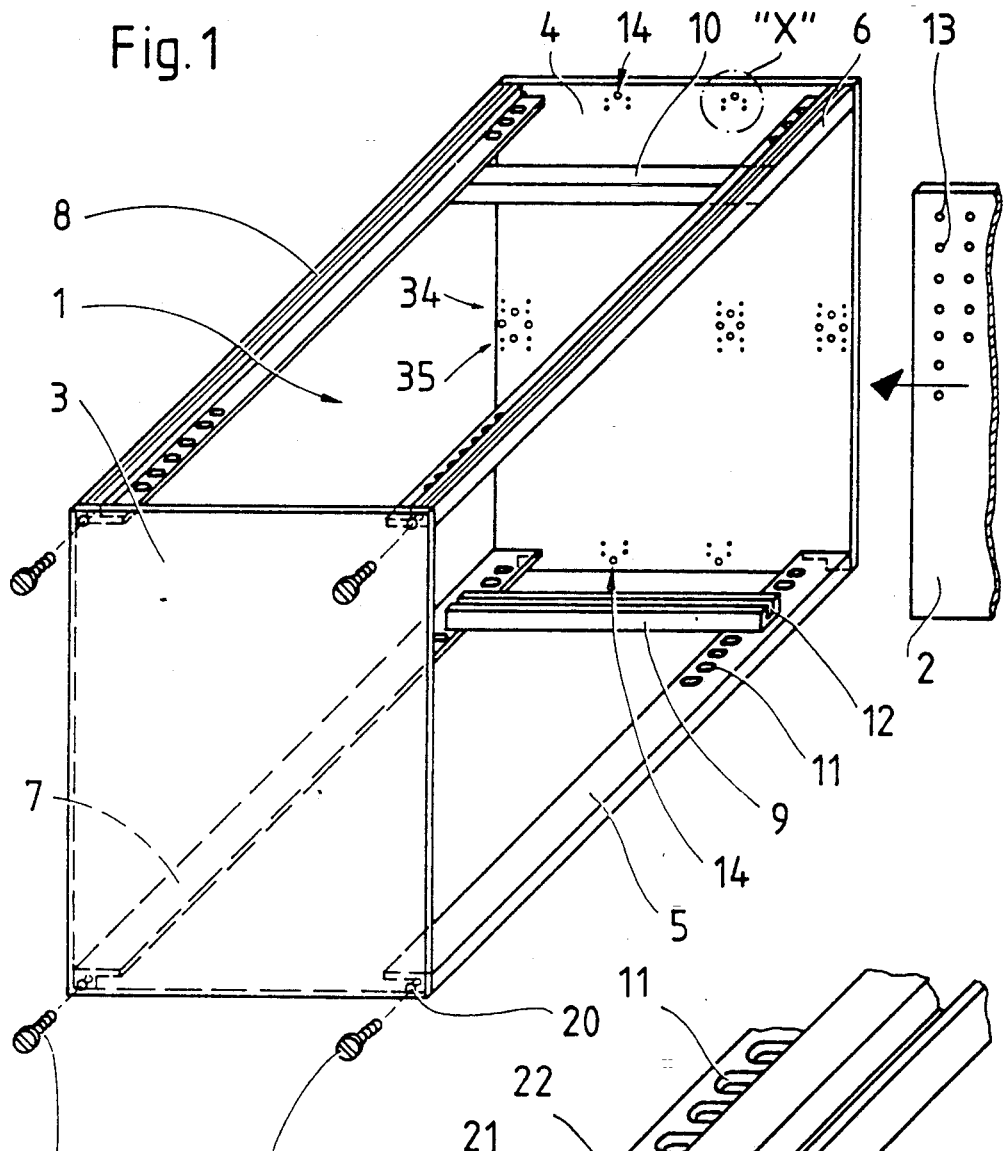

COMPONENT CARRIER

CROSS-REFERENCE TO RELATED APPLICATION

This application claims the priority of Application Ser. No. G 90/12,844.3, filed Sep. 9, 1990, in the Federal Republic of Germany, the subject matter of which is incorporated herein by reference.

BACKGROUND OF THE INVENTION

The present invention relates to a component carrier for circuit boards equipped with electrical and electronic components. These circuit boards are insertable on guide rails and are equipped with two parallel side walls, at least four parallel front and rear module rails which connects the side walls and support the guide rails. In order to fasten the module rails, the side walls are equipped with groups of fastening elements in the form of fastening holes and pins that project on the interior. The end faces of the module rails are provided with blind holes to accommodate fastening screws that pass through the fastening holes and with profiles against whose longitudinal sides the pins lie.

The invention is used for component carriers of any type and dimension which are intended to accommodate circuit boards and are assembled in the manner of a rack of two side walls and at least four module rails that connect the side walls.

In order to connect the module rails with the side walls of a component carrier, fastening elements are known which are provided at the side walls and cooperate with the end faces of the module rails where blind holes are provided. To produce defined fastenings, it is further known to provide low, block-shaped pins on the interior of the side walls with the aid of which the position of the module rails is fixed so as to secure them against twisting. The drawback is here that, in view of the unavoidable tolerances with which components to be connected are generally produced, inaccuracies with respect to the assembled component carrier must be accepted.

SUMMARY OF THE INVENTION

It is an object of the invention to configure the fastening elements for fastening the module rails to the side walls of a module carrier so that, with only little expenditure for technology and while compensating manufacturing tolerances, accurate assembly is possible and twisting of the module rails relative to the side walls is effectively prevented.

This is accomplished in a component carrier of the above-mentioned type in that each group of the fastening elements provided at the side walls includes four fixing pins that are arranged in the corners of a rectangle and form two pairs. Each group has an associated fastening hole and each module rail has a profile that matingly fits into the space between each pair of fixing pins. This configuration of the fastening elements can be produced at little expense, permits simple and quick as well as accurate assembly of the parts of a component carrier and permits the use of different module rail profile configurations.

Advantageously the fixing pins have the shape of a circular cylinder which ensures good compensation of manufacturing tolerances. pattern;

According to a further feature of the invention, the fastening hole of each group of fastening elements lies on the extension of the short center line of the rectangle. This symmetrical arrangement permits the mirror-image attachment of the same fastening elements to the interior of the two facing side walls.

Good protection against twisting is realized if the long side of the rectangle is at least three times longer than its short side.

In order to provide for adaptation to relatively low module rails, the fastening hole is seated in close proximity to the long side of the rectangle.

A very accurate fit of the module rails in the fastening elements of the side walls is realized if the module rails are provided with milled fixing recesses at both ends in which the fixing pins matingly engage.

In order to provide for adaptation to the shape of the fixing pins, the milled fixing recesses are advisably given a trough shape.

For reasons of economical manufacture, the length of the milled fixing recesses will only slightly exceed the height of the fixing pins.

In order to be able to produce component carriers having module rails spaced at different depths so as to accommodate short circuit boards, an edge row of groups composed of four fixing pins and an associated fastening hole are provided alongside the upper edge and the lower edge of the side walls.

In the region of the center of the side walls, two center rows of parallel groups composed of four fixing pins arranged back to back and an associated fastening hole may be provided. This configuration of the component carrier permits the attachment of additional profiled rails in the center to also accommodate reduced height circuit boards at two superposed levels.

According to a further, advantageous feature of the component carrier, an additional row of supplemental holes is provided between the two center rows. These supplemental holes are arranged in pairs and lie on the connecting lines of the short sides of the two rectangles. A central profiled rail at the end face is equipped with bores and, utilizing one of the supplemental holes on each side, is screwed to the respective side wall; its cross-sectional profile engages matingly in the space between the fixing pins of the one group and in the space between the fixing pins of the other group.

BRIEF DESCRIPTION OF THE DRAWINGS

The present invention will now be described in greater detail for one embodiment thereof and with reference to the two attached drawing figures. The drawings show in:

FIG. 1, a simplified perspective view, to a reduced scale, of a component carrier equipped with module rails for circuit boards that are insertable on guide rails;

FIG. 2, an enlarged perspective view of part of a module rail of the component carrier of FIG. 1;

FIG. 3, a detail view marked "X" of the (rear) side wall of the component carrier of FIG. 1, including a group of fastening elements according to the invention composed of four fixing pins and a fastening hole;

DETAILED DESCRIPTION OF THE PREFERRED EMBODIMENT

Figure 4:
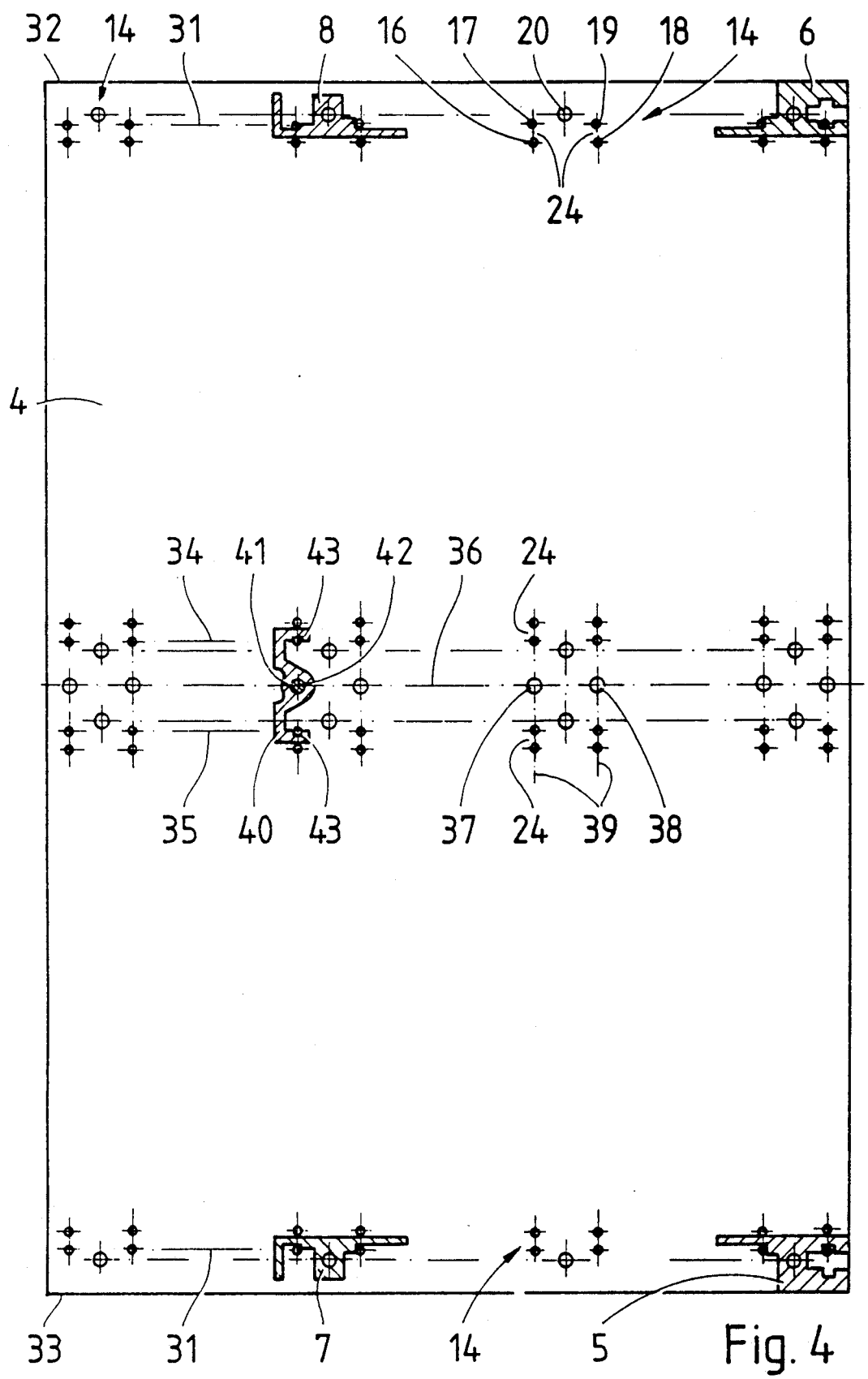
FIG. 4, a vertical sectional view of a component carrier corresponding to FIG. 1, approximately in actual size, including two front and two rear module rails and a profiled rail fastened in the center.

The component carrier 1 shown in FIG. 1 is intended to accommodate a larger number of insertable circuit boards 2 which are equipped with electrical and electronic components (not shown). Component carrier 1 is composed of two rectangular, parallel side walls 3 and 4, two front module rails 5 and 6 and two rear module rails 7 and 8.

The four module rails 5 to 8, which are manufactured of drawn aluminum, connect the two side walls 3 and 4 with one another. Upper and lower guide rails 9 and 10 are clamped by means of resilient clamping elements to each front module rail 5 and 6 and one rear module rail 7 and 8, respectively, transversely to module rails 5 to 8, with these clamping elements being snapped into rows of equidistant long holes 11 provided in the longitudinal direction of module rails 5 to 8.

The identically configured guide rails 10 which are pressed of plastic are provided at their upper sides with a guide groove 12 for the circuit boards 2 to be inserted. This guide groove is equipped with hole arrangements 13 for the components (not shown).

For fastening of module rails 5 to 8, the side walls 3 and 4 are provided with groups 14 of fastening elements. Each one of these identically configured groups 14 includes four fixing pins 16, 17, 18 and 19 which are disposed in the corners of a rectangle 15—indicated in dashed lines in FIG. 3—so as to form two pairs 16, 17 and 18, 19. These fixing pins 16 to 19 project from the two interior faces of side walls 3 and 4. Each one of groups 14 has an associated fastening hole 20 (FIG. 3). These fastening elements serve to fasten module rails 5 to 8 to the side walls 3 and 4 of component carrier 1.

The end face 21 of each module rail 5 to 8 (see FIG. 2) is provided with a blind bore 22 that is provided with an internal thread and serves to receive a fastening screw 23 passing through fastening hole 20. Module rails 5 to 8 have a profile in which, when module rails 5 to 8 are screwed to side walls 3 and 4, fixing pins 16 to 19 lie against their long sides in such a way that parts of the profile engage matingly in the spaces 24 between each pair 16, 17 and 18, 19, as indicated in FIG. 4. The four fixing pins 16 to 19 have the shape of a circular cylinder, see FIG. 3.

The fastening hole 20 of each group 14 of the fastening elements lies in the extension of the short centerline 25 of rectangle 1 in the direction toward the edge of side walls 3 and 4 and is seated in close proximity to the long side 26 of rectangle 15. The long side 26 of the narrow rectangle 15, in whose corners the four fixing pins 16 to 19 are arranged is three times longer than its short side 27.

Module rails 5 to 8 are provided with milled fixing recesses 29 and 30—see FIG. 2—at their two sides 28 in an arrangement which corresponds to the profile of module rails 5 to 8. When module rails 5 to 8 are installed, fixing pins 17 and 19 lie against the sides of the recesses in a mating manner. The two oppositely disposed fixing pins 16 and 18 here contact the sides of module rails 5 to 8 at the corresponding locations. The depth of milled fixing recesses 29 and 30 may be selected so that the profiles of module rails 5 to 8 more or less tightly sit in the spaces 24 between the two pairs 16, 17 and 18, 19 of fixing pins 16 to 19.

Milled fixing recesses 29, 30 at the ends 28 of profiled rails 5 to 8 are given a trough shape; their cross section is semi-circular and corresponds to the circular cross section of fixing pins 16 to 19. The length 1 of milled fixing recesses 29, 30 only slightly exceeds the height h of fixing pins 16 to 19.

As can be seen particularly well in the vertical sectional view of the component carrier 1 shown in FIG. 4, an edge row 31 of groups 14 comprising four fixing pins 16, 17, 18, 19 that project toward the interior and an associated fastening hole 2 is provided along each of the upper edges 32 and the lower edges 33 of side walls 3, 4. The four module rails 5, 6, 7 and 8 are fastened to side wall 4 and their profiles matingly engage in the spaces 24 between each pair 16, 17 and 18, 19 of the four fixing pins 16 to 19. In FIG. 4, the two front module rails 5 and 6 have a somewhat differently configured profile than the two rear module rails 7 and 8.

In the center of side walls 3 and 4, two center rows 34 and 35 of parallel groups 14 each composed of four fixing pins 16 to 19 and one associated fastening hole 20 are provided back to back. With the aid of these two rows of fasting elements, two further central front module rails and two further central rear module rails (not shown) can be fastened between the two side walls 3 and 4 to which corresponding guide rails (not shown) can be clamped. In this way, component carrier 1 can be equipped with circuit boards of a lower height at two superposed levels.

Between the two center rows 34 and 35 of groups 14 of fastening elements, an additional row 36 of supplemental holes 37 and 38 is provided in side walls 3 and 4. These supplemental holes are arranged in pairs between the respective back-to-back groups 14 and lie on the connecting lines 39 between the short sides 27 of the two rectangles 19. By using one of the two supplemental holes 37, a profiled rail 40 is disposed at side walls 3 and 4. It carries a central, end-face bore 41 for a screw 42 provided for fastening it to side wall 4.

Profiled rail 40 has an essentially U-shaped cross-sectional profile, with a bore 41 being provided in its thickened U-base. As can be seen in FIG. 4, the two legs of the U of the cross-sectional profile of the installed profiled rail 40 engage matingly in the space 24 between the fixing pins of the one group 14 as well as in the space 24 between the fixing pins of the other group 14. This profiled rail 40 which is provided as a center support for rear wall plates is also provided with milled fixing recesses 43 that are disposed at the interior faces of the two legs of the U and may be fastened, based on the proposed arrangement of two supplemental holes 37 and 38, selectively so as to be oriented toward the front or toward the back.

It will be understood that the above description of the present invention is susceptible to various modifications, changes and adaptations, and the same are intended to be comprehended within the meaning and range of equivalents of the appended claims.

What is claimed is:

1. In a component carrier including
   two parallel side walls;
   two spaced front module rails each connecting the two side walls to one another and defining a front side of the component carrier;
   two spaced rear module rails each connecting the two side walls to one another and defining a rear side of the component carrier said front and rear module rails having thicknesses and opposite ends;
   said first and second module rails having thicknesses and opposite ends;

support means attached to said front and rear module rails for supporting circuit boards introducible into and removable from said component carrier through the front side thereof; and securing means for attaching at least one of said opposite ends of at least one of the front and rear module rails to one of said side walls;

the improvement wherein said securing means comprises (a) first, second, third and fourth fixing pins affixed to said one side wall in a rectangular pattern; said fixing pins projecting from said one side wall towards said one module rail; said first and second fixing pins being situated at opposite ends of a first side of the rectangular pattern and together defining a first clearance; said third and fourth fixing pins being situated at opposite ends of a second side of the rectangular pattern and together defining a second clearance; said second side being opposite said first side; said first and second clearances matingly receiving two spaced thicknesses of said one module rail at said one end thereof;

(b) a fastening hole provided in said one side wall in the region of said rectangular pattern;

(c) a blind bore provided in said one end of said one module rail; said blind bore being in alignment with said fastening hole; and (d) a fastening screw extending through said fastening hole and received in said blind bore.

2. A component carrier as defined in claim 1, wherein a separate said securing means is disposed at said opposite ends of each of said front and rear module rails.

3. A component carrier as defined in claim 1, wherein the fixing pins each have the shape of a circular cylinder.

4. A component carrier as defined in claim 1, wherein said fastening hole is situated on a center line halving the distance between said first and second sides of said rectangular pattern.

5. A component carrier as defined in claim 1, wherein said first and second sides are the short sides of said rectangular pattern; said rectangular pattern further having opposite long sides being at least three time longer than said short sides.

6. A component carrier as defined in claim 1, wherein said first and second sides are the short sides of said rectangular pattern said rectangular pattern further having opposite long sides; said fastening hole being situated in a close proximity of one of said long sides.

7. A component carrier as defined in claim 1, further comprising fixing recesses provided in said one module rail at said one end thereof; said fixing recesses conformingly receiving circumferential portions of said first and said third fixing pin.

8. A component carrier as defined in claim 7, wherein said fixing recesses are trough-shaped.

9. A component carrier as defined in claim 7, wherein each said fixing pin has a length measured from said one side wall to an outwardly extended end of said fixing pin; said recesses have a length exceeding slightly the length of the fixing pins.

10. A component carrier as defined in claim 1, wherein said first, second, third and fourth fixing pins and said fixing hole constitute a primary fixing group; further comprising a plurality of additional fixing groups structured identically to said primary fixing group and arranged in spaced, parallel first and second rows in a center zone of said one side wall; said additional fixing groups being aligned relative to one another such that with the first and second fixing pin of each said additional fixing group forming part of the first row there is aligned the first and second fixing pin of one said additional fixing group forming part of the second row and with the third and fourth fixing pin of each said additional fixing group forming part of the first row there is aligned the third and fourth fixing pin of one said additional fixing group forming part of the second row; further wherein any two said additional fixing groups belonging to different rows and being in alignment with one another are in a mirror-image arrangement relative to the respective fixing holes of said any two additional fixing groups.

11. A component carrier as defined in claim 10, further comprising a plurality of additional fixing holes forming a third row extending between and parallel to said first and second rows; each additional fixing hole being in alignment with the aligned fixing pins of any two aligned additional fixing groups belonging to different rows; wherein the first and second sides of the rectangular pattern in each said additional fixing group are the short sides of the rectangular pattern; further comprising a central profiled rail having an end face oriented to said one side wall; a securing screw passing through one of said additional fixing holes in said one side wall and being received in a bore provided in said end face of said profiled rail; said profiled rail having a first cross-sectional thickness matingly received in a clearance defined between two fixing pins lying on one of the short sides of the rectangular pattern of a selected said additional fixing group of the first row; said profiled rail having a second cross-sectional thickness matingly received in a clearance defined between two fixing pins lying on one of the short sides of a selected said additional fixing group of the second row; said two fixing pins of the selected additional fixing group of the first row being in alignment with said two fixing pins of the selected additional fixing group of the second row.

* * * * *